United States Patent
Ueki

(10) Patent No.: US 10,559,487 B2
(45) Date of Patent: Feb. 11, 2020

(54) WAFER DIVIDING METHOD AND DIVIDING APPARATUS

(71) Applicant: DISCO CORPORATION, Tokyo (JP)

(72) Inventor: Atsushi Ueki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 66 days.

(21) Appl. No.: 15/996,902

(22) Filed: Jun. 4, 2018

(65) Prior Publication Data

US 2018/0358256 A1 Dec. 13, 2018

(30) Foreign Application Priority Data

Jun. 7, 2017 (JP) .................................. 2017-112265

(51) Int. Cl.
| | | |
|---|---|---|
| *H01L 21/683* | (2006.01) | |
| *H01L 21/78* | (2006.01) | |
| *H01L 21/67* | (2006.01) | |

(52) U.S. Cl.
CPC .... *H01L 21/6836* (2013.01); *H01L 21/67092* (2013.01); *H01L 21/6838* (2013.01); *H01L 21/78* (2013.01); *H01L 2221/68336* (2013.01)

(58) Field of Classification Search
CPC ............. H01L 21/6836; H01L 21/6838; H01L 21/67092; H01L 21/78
See application file for complete search history.

(56) References Cited

U.S. PATENT DOCUMENTS

| | | | | |
|---|---|---|---|---|
| 2006/0035444 A1* | 2/2006 | Nakamura | ........... | H01L 21/6836 438/464 |
| 2006/0084239 A1* | 4/2006 | Nagai | ................. | B28D 5/0011 438/460 |
| 2008/0105383 A1* | 5/2008 | Kubo | ................ | H01L 21/67132 156/494 |
| 2008/0190902 A1* | 8/2008 | Nakamura | ........... | B28D 5/0011 219/121.67 |
| 2017/0140972 A1* | 5/2017 | Kimura | ............... | H01L 21/6836 |
| 2017/0162521 A1* | 6/2017 | Nakamura | ........ | H01L 21/02076 |

FOREIGN PATENT DOCUMENTS

| | | |
|---|---|---|
| JP | 2002334852 A | 11/2002 |
| JP | 2005129607 A | 5/2005 |
| JP | 2013239557 A | 11/2013 |

\* cited by examiner

*Primary Examiner* — Michele Fan

(74) *Attorney, Agent, or Firm* — Greer Burns & Crain Ltd.

(57) ABSTRACT

A wafer is divided at division starting points along division lines to form a predetermined gap between adjacent chips. Next, that area of a tape to which the wafer is adhered is suction held by a table, after which the table and a ring frame holding section are relatively moved further away from each other to expand the tape in a ring shape between an outer periphery of the wafer and an inner periphery of a ring frame. Thereafter, the table and the ring frame holding section are relatively moved closer to each other to slacken the ring-shaped tape, and the ring-shaped tape is heated by a heater, to heat shrink the tape and to maintain the predetermined gap between the adjacent chips.

2 Claims, 4 Drawing Sheets

WAFER DIVIDING METHOD AND DIVIDING APPARATUS

BACKGROUND OF THE INVENTION

Field of the Invention

The present invention relates to a wafer dividing method and a dividing apparatus for dividing a wafer into individual chips.

Description of the Related Art

In recent years, there has been known a method of obtaining a larger number of chips from one sheet of wafer by making narrow the line width of division lines on the wafer (see, for example, Japanese Patent Laid-open No. 2005-129607). In a wafer dividing method described in Japanese Patent Laid-open No. 2005-129607, a laser beam transmittable through a wafer is applied to the wafer, to form modified layers in the inside of the wafer along the division lines. Thereafter, a tape attached to a ring frame is expanded by an expanding apparatus or the like, to exert an external force on the wafer adhered to an upper surface of the tape, thereby dividing the wafer into individual chips, with the modified layers as division starting points.

The chip interval is widened by the expansion of the tape, but, when the expansion of the tape is released, large wrinkles (slacks) are generated in the sheet, possibly causing the adjacent chips to contact each other and to be broken. In view of this, there has been proposed a method of maintaining the chip interval by heating the tape between an outer periphery of the wafer and an inner periphery of the ring frame such as to heat shrink the tape (see, for example, Japanese Patent Laid-open No. 2002-334852). In addition, there has also been proposed a method of grasping the wrinkles of the tape generated in the periphery of the wafer and putting the wrinkles to thermocompression bonding, to thereby remove the wrinkles from the tape (see, for example, Japanese Patent Laid-open No. 2013-239557).

SUMMARY OF THE INVENTION

In Japanese Patent Laid-open No. 2002-334852 and Japanese Patent Laid-open No. 2013-239557, at the time of heat shrinking or thermocompression bonding of the tape at an outer peripheral portion of the wafer, the expanded tape is suction held by a holding table so as to maintain the shape of the tape. On the other hand, for dividing a wafer with a small chip size, it is necessary to largely expand the tape. In the case where the tape is thus expanded, a high tension is applied to the tape, so that a shrinking force generated due to elastic recovery of the tape will be large when heat shrink or thermocompression bonding is conducted. Therefore, it becomes difficult to maintain the shape of the tape by the suction force of the holding table, so that, before the heat shrinkage or the like of the tape, the interval of the chips is narrowed due to shrinkage of the tape, causing a trouble in picking up the chips.

Accordingly, it is an object of the present invention to provide a wafer dividing method and a dividing apparatus by which the interval of chips can be maintained appropriately.

In accordance with an aspect of the present invention, there is provided a wafer dividing method using a dividing apparatus, the dividing apparatus including a table adapted to suction hold a wafer through a heat-shrinkable tape of a work set, the work set having the tape attached to a ring frame to close an opening of the ring frame, the wafer being formed with division starting points along division lines and attached to the tape at the opening; a ring frame holding section adapted to hold the ring frame of the work set; a lifting unit adapted to relatively move the table and the ring frame holding section in a vertical direction for bringing them closer to and away from each other; and a heater adapted to heat the tape in a ring shape between an outer periphery of the wafer and an inner periphery of the ring frame of the work set, the table and the ring frame holding section being relatively moved respectively in an upward direction and a downward direction such as to be spaced away from each other by the lifting unit, in a state in which the work set is held by the ring frame holding section, to expand the tape at the opening and thereby to divide the wafer at the division starting points into chips, the water dividing method including: a holding step of holding the work set by the ring frame holding section; a dividing step of relatively moving the table and the ring frame holding section away from each other by the lifting unit to expand the tape, and dividing the wafer at the division starting points to form a predetermined gap between the adjacent chips, after the holding step; a tape holding step of suction holding that area of the expanded tape to which the wafer is adhered by the table, after the dividing step; a ring tape expanding step of relatively moving the table and the ring frame holding section further away from each other, to expand the ring-shaped tape between the outer periphery of the wafer and the inner periphery of the ring frame, after the tape holding step; and a fixing step of relatively moving the table and the ring frame holding section closer to each other by the lifting unit to slacken the ring-shaped tape and heating the ring-shaped tape by the heater, to heat shrink the ring-shaped tape and to fix the work set while maintaining the predetermined gap between the adjacent chips, after the ring tape expanding step.

According to this configuration, after the wafer is divided by the dividing step, the ring-shaped tape is heat shrunk in the fixing step after being further expanded while maintaining the shape of the tape, in the area where the wafer is adhered, by suction holding the expanded tape by the table. By this, it is ensured that, even when the ring-shaped tape is slackened during the fixing step, the shape of the tape in the area where the wafer is adhered can be maintained, and the spacing between the adjacent chips can be maintained appropriately.

In accordance with another aspect of the present invention, there is provided a dividing apparatus for dividing a wafer formed with division starting points along division lines, the dividing apparatus including: a table adapted to suction hold the wafer through a heat-shrinkable tape of a work set, the work set having the tape attached to a ring frame to close an opening of the ring frame, the wafer being formed with the division starting points along the division lines and attached to the tape at the opening; a ring frame holding section adapted to hold the ring frame of the work set; a lifting unit adapted to relatively move the table and the ring frame holding section in a vertical direction such as to bring them closer to and away from each other; a heater adapted to heat the tape in a ring shape between an outer periphery of the wafer and an inner periphery of the ring frame of the work set; and a control unit adapted to control the lifting unit, in which the control unit includes a first control section adapted to relatively move the table and the ring frame holding section away from each other such as to form a first spacing therebetween, thereby expanding the tape and dividing the wafer, and a second control section adapted to relatively move the table and the ring frame holding section further away from each other than the first spacing such as to form a second spacing therebetween, thereby expanding the ring-shaped tape.

According to the present invention, after the ring-shaped tape between the wafer and the ring frame is expanded in the dividing step, it is further expanded in the ring tape expanding step. Therefore, the spacing between the adjacent chips can be appropriately maintained even upon heat shrink of the tape.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
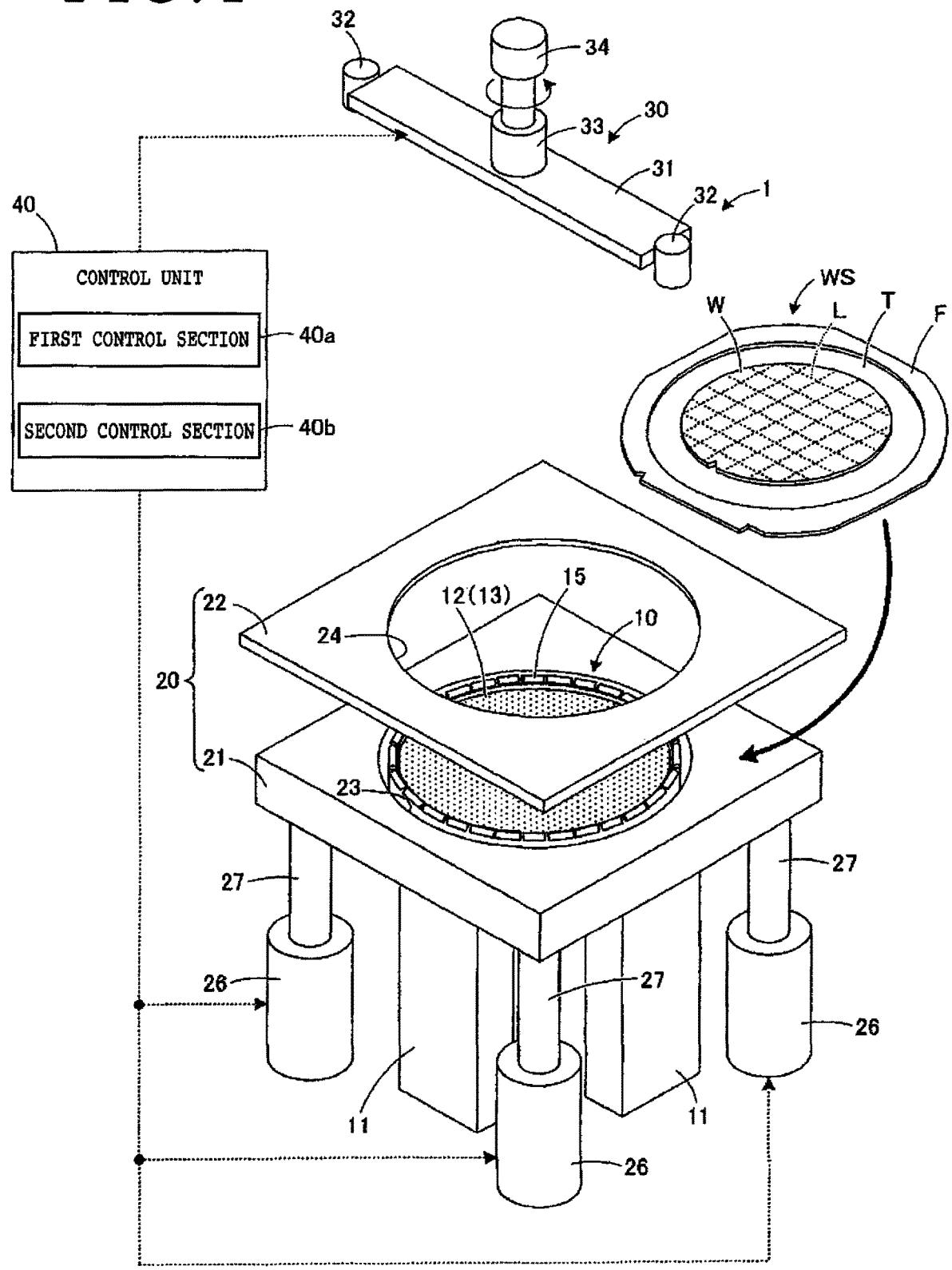
FIG. 1 is a perspective view of a dividing apparatus according to an embodiment of the present invention.

A dividing apparatus according to an embodiment of the present invention will be described below, referring to the attached drawings. FIG. 1 is a perspective view of a dividing apparatus 1 according to the present embodiment. Note that the dividing apparatus 1 is not limited to the configuration depicted in FIG. 1, and may be modified as required.

As depicted in FIG. 1, the dividing apparatus 1 is configured such that a wafer W supported on a ring frame F through a tape T is divided into individual chips C (see FIG. 2A) by expanding the tape T. In addition, the dividing apparatus 1 is configured such that a slack of the tape T generated between an outer periphery of the wafer W and an inner periphery of the ring frame F upon release of the expansion of the tape T is removed by heat shrink. Thus, only the part where the tape T is expanded and slackened is heat shrunk, whereby the spacing between the chips C is maintained such that the chips C after the division of the wafer W will not be broken by contact with one another.

Division lines L in a grid pattern are provided on a front surface of the wafer W, and various devices (not depicted) are formed in regions partitioned by the division lines L. Note that the wafer W may be a semiconductor wafer having devices such as ICs (Integrated Circuits) and LSIs (Large Scale Integrated Circuits) formed on a semiconductor substrate of silicon, gallium arsenide or the like, or may be an optical device wafer having optical devices such as LEDs (Light Emitting Diodes) formed on an inorganic material substrate based on a ceramic, a glass or sapphire. The wafer W is adhered to the tape T attached to the ring frame F, and a work set WS obtained by uniting the wafer W, the ring frame F and the tape T is fed to the dividing apparatus 1.

The ring frame F of the work set WS has an opening closed with the tape T, which is heat shrinkable, and the wafer W is adhered to the tape T on the inside of the opening. The wafer W is formed therein with modified layers (not depicted) as division starting points along the division lines L. Note that the modified layer refers to that region in the inside of the wafer W which is made to be different from the surroundings in a physical property such as density, refractive index, or mechanical strength by irradiation with laser and which is made to be lower than the surroundings in strength. The modified layer is, for example, a melting treatment region, a crack region, a dielectric breakdown region, or a refractive index varied region, or may be a region of a combination of these.

In addition, while modified layers formed in the inside of the wafer W will be depicted as an example of division starting points in the following description, this configuration is not limitative. The division starting points need only be starting points at the time of division of the wafer W, and may be configured, for example, by laser-processed grooves, cut grooves or scribed lines. Further, the tape T need only be elastic and heat shrinkable, and is not particularly limited in regard of material. Note that a tape base material is preferably formed of PO (Polyolefin) or PVC (Polyvinyl Chloride).

In the dividing apparatus 1, there is disposed a table 10 capable of suction holding the wafer W thereon through the tape T of the work set WS, and a ring frame holding section 20 that holds the ring frame F of the work set WS is disposed in the surroundings of the table 10. The table 10 is supported by a plurality of support columns 11, and a porous plate 12 is disposed at an upper surface of the table 10. The porous plate 12 forms a holding surface 13 for suction holding the wafer W on the upper surface of the table 10. The holding surface 13 is connected to a suction source 16 (see FIG. 2A) through a passage provided in the inside of the table 10, and the wafer W is suction held by a negative pressure generated at the holding surface 13.

In addition, an on-off valve 14 (see FIG. 2A) is provided in the passage extending from the holding surface 13 to the suction source 16, and suction holding and release of suction at the holding surface 13 for the wafer W are switched over by the on-off valve 14. At an outer peripheral edge of the table 10, a plurality of roller sections 15 are rotatably provided over the whole circumference. In a state in which the wafer W is held on the holding surface 13, the plurality of roller sections 15 are in rolling contact, from below, with the tape T at the periphery of the wafer W. With the plurality of roller sections 15 in rolling contact with the tape T, friction of the tape T generated at the outer peripheral edge of the table 10 at the time of expansion of the tape T is restrained.

The ring frame holding section 20 holds the ring frame F on a mount table 21 in such a manner as to clamp the ring frame F on the mount table 21 with a cover plate 22 from above. The mount table 21 and the cover plate 22 are formed in their center with circular openings 23 and 24 which are larger in diameter than the table 10. When the cover plate 22 is put on the mount table 21, the ring frame F is held by the cover plate 22 and the mount table 21, and the wafer W and the tape T are partly exposed to the exterior through the circular openings 23 and 24 of the mount table 21 and the cover plate 22.

The ring frame holding section 20 is configured such that in a state in which the cover plate 22 is put on the ring frame F on the mount table 21, the cover plate 22 is fixed to the mount table 21 by, for example, clamp sections which are not depicted. The ring frame holding section 20 is supported by a lifting unit 26 that relatively moves the table 10 and the ring frame holding section 20 in a vertical direction such as to bring them closer to and away from each other. The lifting unit 26 is composed of four electrically driven cylinders that support four corners of the mount table 21. Projection amount of cylinder rods 27 of the lifting unit 26 is controlled, whereby the distance between the wafer W on the table 10 and the ring frame holding section 20 is controlled.

On the upper side of the ring frame holding section 20, there is provided a shrinking unit 30 that shrinks a slack generated in the tape T. The shrinking unit 30 is provided on a center axis of the wafer W, and a pair of heaters 32 are disposed at both ends of a turning arm 31 in such a manner as to face each other, with the center of the wafer W therebetween. The heaters 32 are configured, for example, to apply in a spot form far infrared rays with a peak waveform of 2.5 to 30 μm which are less liable to be absorbed in metallic material. By this, the slack of the ring-shaped tape T between the outer periphery of the wafer W and the inner periphery of the ring frame F is partly heated and heat shrunk, while restraining heating of each part of the apparatus.

In addition, the turning arm 31 of the shrinking unit 30 is provided with a vertical moving section 33 that moves the pair of heaters 32 vertically, and a rotary motor 34 that rotates the pair of heaters 32 about the center axis of the wafer W. The vertical moving section 33 controls the height of the pair of heaters 32 relative to the tape T, according to a vertical movement of the ring frame holding section 20. The rotary motor 34 turns the pair of heaters 32 in such a manner that the slack of the tape T in the surroundings of the wafer W is heated over the whole circumference. The pair of heaters 32 are appropriately positioned relative to the tape T by the vertical moving section 33 and the rotary motor 34, whereby the tape T in the periphery of the wafer W is heated favorably.

Besides, the dividing apparatus 1 is provided with a control unit 40 that performs integrated control of parts of the apparatus inclusive of the lifting unit 26. The control unit 40 is composed of a processor that executes various kinds of processing, and a memory and the like. The memory is composed of one or a plurality of recording media such as a ROM (Read Only Memory) and a RAM (Random Access Memory). By the control unit 40, the table 10 and the ring frame holding section 20 are relatively moved, whereby an expanding operation of the tape T is controlled, and the slack of the tape T is removed by the pair of heaters 32 of the shrinking unit 30, and a shrinking operation of the tape T is controlled. Further, the control unit 40 has a first control section 40a and a second control section 40b that control the movement of the ring frame holding section 20 by the lifting unit 26 as will be described later.

Figure 2A:
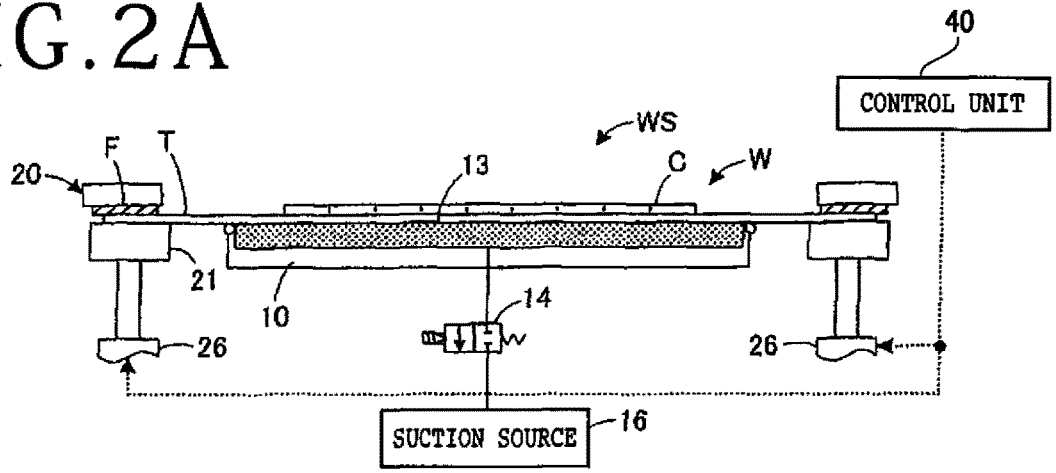
FIG. 2A is a sectional view depicting an example of a holding step.
Figure 2B:
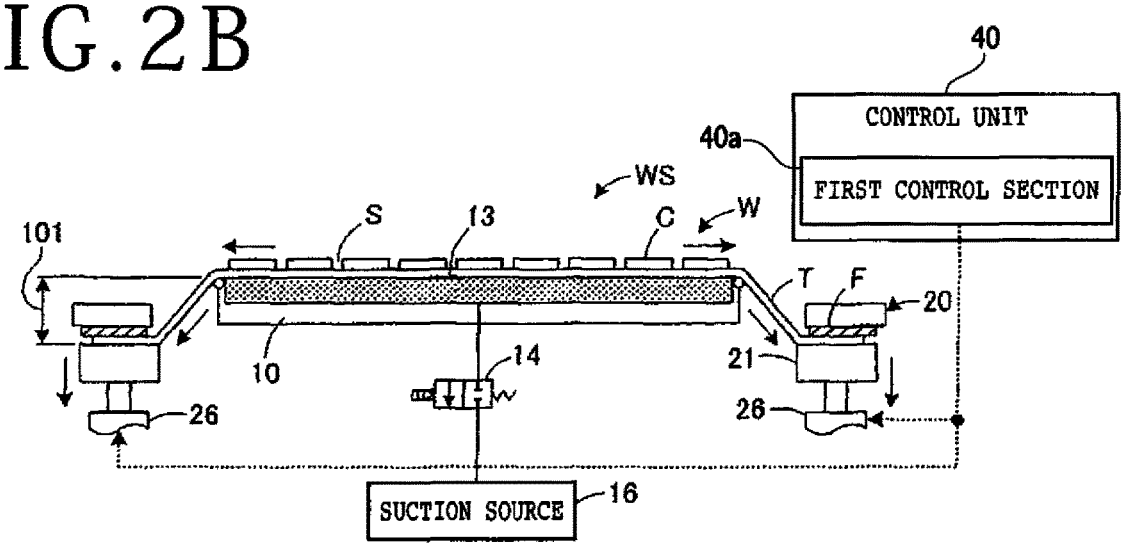
FIG. 2B is a sectional view depicting an example of a dividing step.
Figure 2C:
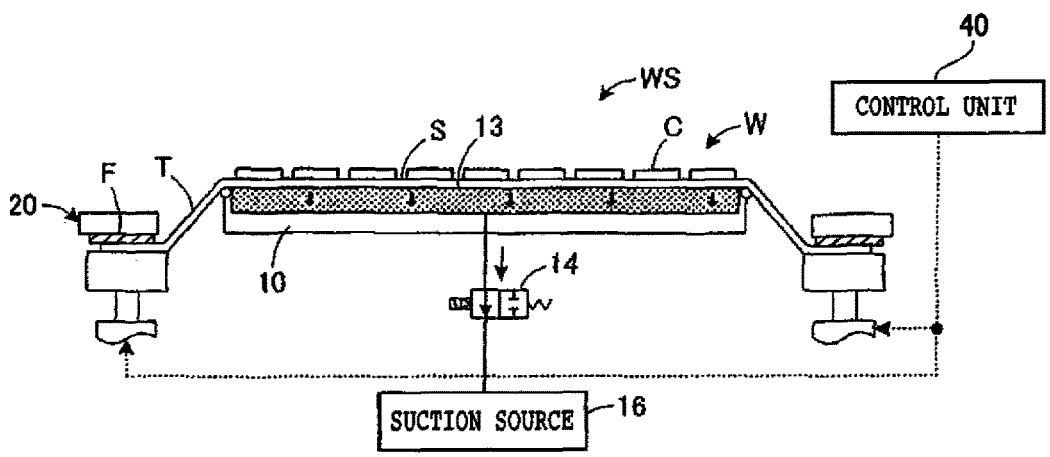
FIG. 2C is a sectional view depicting an example of a tape holding step.
Figure 3:
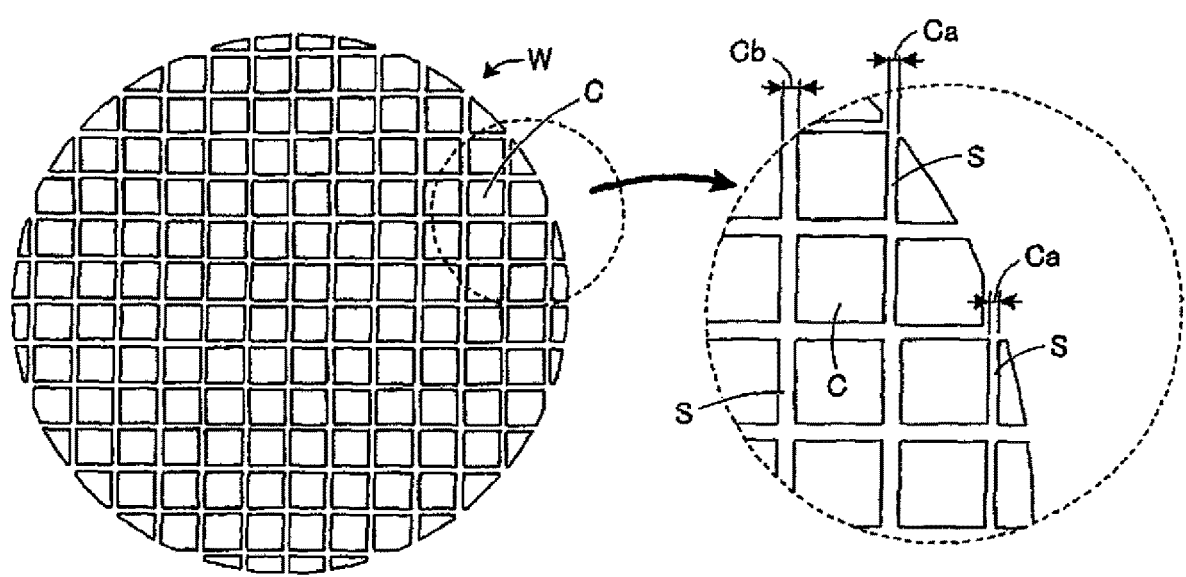
FIG. 3 is a plan view depicting an exemplary trouble as to the spacing between chips.
Figure 4A:
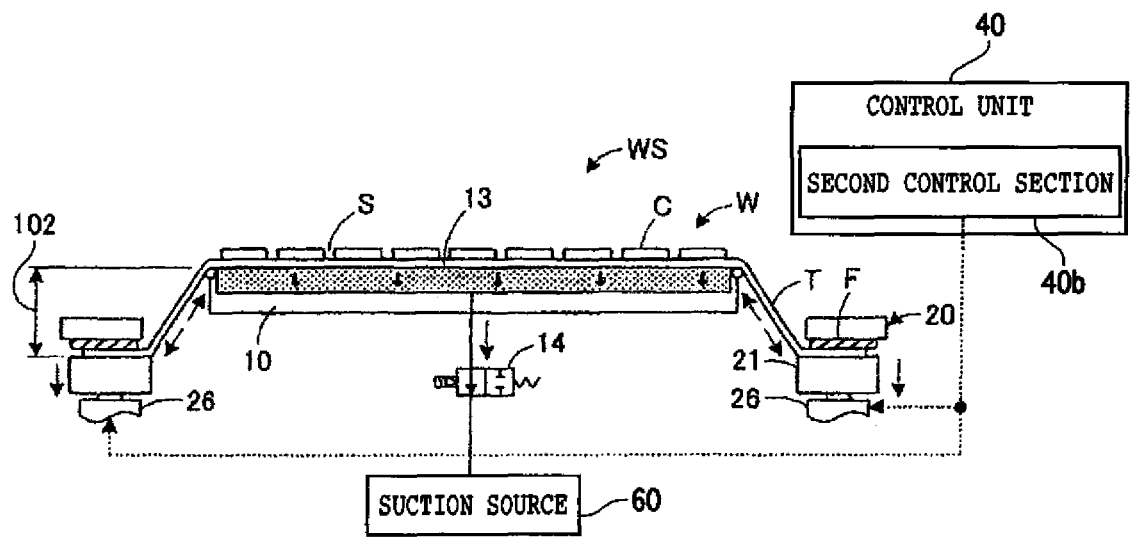
FIG. 4A is a sectional view depicting an example of a ring tape expanding step.
Figure 4B:
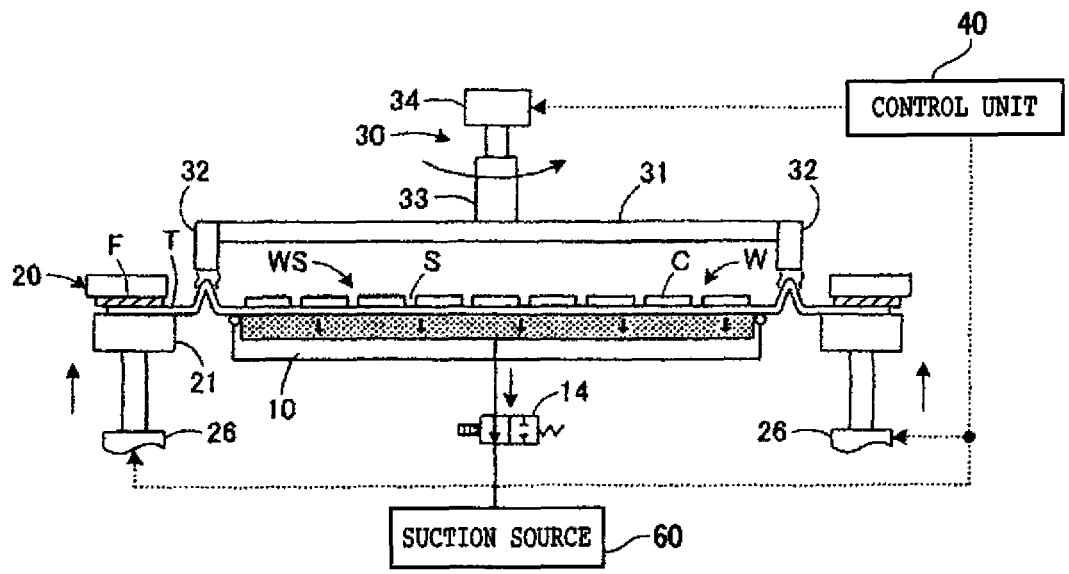
FIG. 4B is a sectional view depicting an example of a fixing step.

A wafer dividing method by the dividing apparatus according to the present embodiment will be described below, referring to FIGS. 2A to 4B. FIG. 2A is an illustration of an example of a holding step, FIG. 2B is an illustration of an example of a dividing step, and FIG. 2C is an illustration of an example of a tape holding step. FIG. 3 is an illustration of an exemplary trouble as to the spacing between chips. FIG. 4A is an illustration of an example of a ring tape expanding step, and FIG. 4B is an illustration of an example of a fixing step.

As depicted in FIG. 2A, a holding step is first performed. In the holding step, in a state in which the holding surface 13 of the table 10 and an upper surface of the mount table 21 of the ring frame holding section 20 are disposed on the same plane, the wafer W is mounted on the table 10 through the tape T. Thereafter, the ring frame F in the periphery of the wafer W is held by the ring frame holding section 20; in other words, the work set WS is held by the ring frame holding section 20. In this instance, the on-off valve 14 is in a closed state, and supply of a suction force from the suction source 16 to the table 10 is in an interrupted state.

As depicted in FIG. 2B, a dividing step is performed after the holding step. In the dividing step, in a state in which the work set WS is held by the ring frame holding section 20, the table 10 and the ring frame holding section 20 are relatively moved respectively in an upward direction and a downward direction such as to be spaced away from each other, under the control of the first control section 40a of the control unit 40. Specifically, the ring frame holding section 20 is lowered, whereby the table 10 and the ring frame holding section 20 are vertically spaced away from each other. In this instance, the holding surface 13 of the table 10 and the upper surface of the mount table 21 become different in height, and a first spacing 101 is formed therebetween. By this, the tape T is expanded radially, and the wafer W is divided, with the modified layers reduced in strength as division starting points, into individual chips C through the tape T. By the division, a predetermined gap S is formed between the adjacent chips C.

As depicted in FIG. 2C, a tape holding step is performed after the dividing step. In the tape holding step, in a state in which the gap S is formed between the adjacent chips C, the on-off valve 14 is opened. By this, a suction force is generated at the holding surface 13 of the table 10, whereby that area of the expanded tape T to which the wafer W is adhered is suction held by the holding surface 13.

Meanwhile, when the ring frame F is moved upward to release the expansion of the tape T after the division of the wafer W, the tension on the tape T is slackened. In this instance, in the existing dividing apparatus, in order to prevent the ring-shaped tape T between the outer periphery of the wafer W and the inner periphery (opening) of the ring frame F from slackening, such a tape T has been heated and thereby heat shrunk. At the time of this heating of the tape T, although the tape T in the area where the wafer W is adhered is suction held by the table 10, if the tension on the tape T is increased, the tape T would shrink due to elastic recovery before being heat shrunk. Therefore, as depicted in FIG. 3, particularly at an outer peripheral portion of the wafer W, the spacing Ca of the gap S between the adjacent chips C is smaller than the spacing Cb equal to a preset spacing at other portions, with the result that it may be impossible to pick up the chip C.

In view of this, in the present embodiment, after the tape holding step and before the fixing step of heating the tape T to heat shrink the tape T is conducted, a ring tape expanding step is performed, as depicted in FIG. 4A. In the ring tape expanding step, while the suction holding of the tape T by the table 10 in the tape holding step is maintained, the ring frame holding section 20 is lowered, whereby the table 10 and the ring frame holding section 20 are further spaced away vertically. In this spacing-away, the lifting unit 26 is controlled by the second control section 40b of the control unit 40, and the holding surface 13 of the table 10 is moved in such a manner as to become further higher than the upper surface of the mount table 21, whereby a second spacing 102 larger than the first spacing 101 (see FIG. 2B) is formed therebetween. By this, the ring-shaped tape T between the wafer W and the ring frame F is further expanded, as compared to the state in the dividing step, so that elastic recovery of the ring-shaped tape T is less liable to occur. In this instance, that area of the tape T in which the wafer W is adhered is suction held by the table 10, and, therefore, the tape T is not expanded and the predetermined gap S between the adjacent chips C is maintained in this area.

As depicted in FIG. 4B, a fixing step is conducted after the ring tape expanding step. In the fixing step, while the suction holding of the tape T by the table 10 is maintained, the lifting unit 26 is controlled by the control unit 40 to relatively move the table 10 and the ring frame holding section 20 closer to each other. By this movement, a slack is generated in the ring-shaped tape T between the wafer W and the ring frame F. In the shrinking unit 30 located on the upper side of the wafer W, however, the pair of heaters 32 are turned by the rotary motor 34, and the slack of the tape T is heat shrunk. In this instance, the height of the heaters 32 is controlled by the vertical moving section 33, according to the approaching movement of the table 10 and the ring frame holding section 20. Since only the ring-shaped tape T in the periphery of the wafer W is heat shrunk, even when the suction holding by the table 10 is released, the work set WS is fixed in a state in which the gap S between the adjacent chips C is maintained at the predetermined spacing. Then, the on-off valve 14 is closed after the fixing step, whereby the suction of the tape T by the table 10 is released, enabling the work set WS to be carried.

Thus, in the present embodiment, after the ring-shaped tape T between the wafer W and the ring frame F is expanded in the dividing step, it is expanded further in the ring tape expanding step, and, therefore, a force of elastic recovery generated when the ring-shaped tape T is slackened can be weakened. By this, when the ring-shaped tape T is heat shrunk in the fixing step, a force in the shrinking direction exerted on the tape T adhered to an outer peripheral region of the wafer W can be restrained; particularly, a reduction in the gap S between the adjacent chips C at an outer peripheral portion of the wafer W can be avoided. As a result, pick-up of the chips C in the later step can be performed normally, and, by causing a picker to operate according to a prescribed operation program, all the chips C can be picked up appropriately.

Note that the shrinking unit 30 can be modified variously, so long as it can heat shrink the tape T in the similar manner to that in the present embodiment. For example, only one heater 32 may be disposed at one end portion of the turning arm 31. Alternatively, the heater may be formed in a ring shape correspondingly to the ring-shaped tape T between the wafer W and the ring frame F, and the turning arm 31 and the rotary motor 34 may be omitted.

In addition, while a configuration in which the lifting unit 26 moves the ring frame holding section 20 vertically relative to the table 10 has been adopted in the present embodiment, this configuration is not restrictive. The lifting unit 26 need only be configured to relatively move the table 10 and the ring frame holding section 20 closer to and away from each other; for example, the lifting unit 26 may be configured to move the table 10 vertically relative to the ring frame holding section 20. Besides, the lifting unit 26 is not limited to the one composed of the electrically driven cylinders, and may be composed of air cylinders each of which is contracted and expanded at two stages, or may be composed of other actuators each of which is united by connecting two air cylinders in the contraction-expansion direction.

Besides, the embodiment of the present invention is not limited to the above-described embodiment and modifications, and various changes, replacements and modifications may be made without departing from the gist of the technical thought of the present invention. Furthermore, if the technical thought of the present invention can be realized in a different manner, owing to the progress of technology or by other derived technology, the present invention may be carried out by the different method. Accordingly, the claims cover all the embodiments which can fall within the scope of the technical thought of the present invention.

As has been described above, the present invention has an effect to make it possible to divide a wafer in such a manner as to realize an appropriate spacing between chips, and is particularly useful for a dividing method and a dividing apparatus for dividing a semiconductor wafer.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer dividing method using a dividing apparatus, the dividing apparatus including a table adapted to suction hold a wafer through a heat-shrinkable tape of a work set, the work set having the tape attached to a ring frame to close an opening of the ring frame, the wafer being formed with division starting points along division lines and attached to the tape at the opening; a ring frame holding section adapted to hold the ring frame of the work set; a lifting unit adapted to relatively move the table and the ring frame holding section in a vertical direction for bringing them closer to and away from each other; and a heater adapted to heat the tape in a ring shape between an outer periphery of the wafer and an inner periphery of the ring frame of the work set, the table and the ring frame holding section being relatively moved respectively in an upward direction and a downward direction such as to be spaced away from each other by the lifting unit, in a state in which the work set is held by the ring frame holding section, to expand the tape at the opening and thereby to divide the wafer at the division starting points into chips, the wafer dividing method comprising:

a holding step of holding the work set by the ring frame holding section;

a dividing step of relatively moving the table and the ring frame holding section away from each other by the lifting unit to expand the tape, and dividing the wafer at the division starting points to form a predetermined gap between the adjacent chips, after the holding step;

a tape holding step of suction holding that area of the expanded tape to which the wafer is adhered by the table, after the dividing step;

a ring tape expanding step of relatively moving the table and the ring frame holding section further away from each other, to expand the ring-shaped tape between the outer periphery of the wafer and the inner periphery of the ring frame, after the tape holding step; and a fixing step of relatively moving the table and the ring frame holding section closer to each other by the lifting unit to slacken the ring-shaped tape and heating the ring-shaped tape by the heater, to heat shrink the ring-shaped tape and to fix the work set while maintaining the predetermined gap between the adjacent chips, after the ring tape expanding step.

2. A dividing apparatus for dividing a wafer formed with division starting points along division lines, the dividing apparatus comprising:

a table adapted to suction hold the wafer through a heat-shrinkable tape of a work set, the work set having the tape attached to a ring frame to close an opening of the ring frame, the wafer being formed with the division starting points along the division lines and attached to the tape at the opening;

a ring frame holding section adapted to hold the ring frame of the work set;

a lifting unit adapted to relatively move the table and the ring frame holding section in a vertical direction such as to bring them closer to and away from each other;

a heater adapted to heat the tape in a ring shape between an outer periphery of the wafer and an inner periphery of the ring frame of the work set; and a control unit adapted to control the lifting unit, wherein the control unit includes a first control section adapted to relatively move the table and the ring frame holding section away from each other such as to form a first spacing therebetween, thereby expanding the tape and dividing the wafer, and a second control section adapted to relatively move the table and the ring frame holding section further away from each other than the first spacing such as to form a second spacing therebetween, thereby expanding the ring-shaped tape.

* * * * *